(12) United States Patent
Bylsma et al.

(10) Patent No.: US 6,310,902 B1
(45) Date of Patent: Oct. 30, 2001

(54) MODULATOR FOR ANALOG APPLICATIONS

(75) Inventors: Richard Bendicks Bylsma, Allentown, PA (US); Leonard Jan-Peter Ketelsen, Clinton; Sharon Kay Sputz, Teaneck, both of NJ (US)

(73) Assignee: Agere Systems Optoelectronics Guardian Corp., Orlando, FL (US)

( * ) Notice: Subject to any disclaimer, the term of this patent is extended or adjusted under 35 U.S.C. 154(b) by 0 days.

(21) Appl. No.: 09/069,109

(22) Filed: Apr. 29, 1998

(51) Int. Cl.[7] .................................... H01S 5/026
(52) U.S. Cl. ................ 372/50; 372/26; 385/14; 385/131
(58) Field of Search ................ 372/45, 46, 50, 372/26; 385/14, 131

(56) References Cited

U.S. PATENT DOCUMENTS 4,875,750 * 10/1989 Spaeth et al. ................ 385/35
6,150,667 * 11/2000 Ishizaka et al. ................ 257/21

OTHER PUBLICATIONS

"High–Speed Integrated Electroabsorption Modulators", John E. Johnson et al., Proceedings of SPIE, High–Speed Semiconductor Lasers for Communication, Feb. 10–11, 1997, San Jose, California, vol. 3038, pp. 30–38.

"Novel Structure MQW Electroabsorption Modulator/DFB–Laser Integrated Device Fabricated By Selective Area MOCVD Growth", M. Aoki et al., Electronics Letters, Nov. 7, 1991, vol. 27, No. 23, pp. 2138–2140.

* cited by examiner

*Primary Examiner*—James W. Davie
(74) *Attorney, Agent, or Firm*—Lester H. Birnbaum

(57) ABSTRACT

The invention in one aspect is an optical modulator which includes a waveguide region of semiconductor material. In order to achieve a gradual, essentially linear transfer function, the bandgap of the waveguide region is graded along the direction of light propogation or perpendicular thereto. In accordance with another aspect, the invention is an electroabsorption modulated laser where the portion of the waveguide region defining the modulator has a graded bandgap. In accordance with a method aspect, the waveguide region of the modulator is grown using a mask having a varying width to achieve the graded bandgap.

15 Claims, 2 Drawing Sheets

MODULATOR FOR ANALOG APPLICATIONS

FIELD OF THE INVENTION

This invention relates to modulators such as included in electroabsorption modulated lasers (EML), and in particular to a structure and method of fabricating such modulators for analog applications.

BACKGROUND OF THE INVENTION

Electroabsorption modulated lasers (EMLs) are known in the art primarily for digital applications. Such lasers typically include a multi-quantum well laser and a modulator formed in a body of InP. (See, eg, Johnson, et al., "High Speed Integrated Electroabsorption Modulators" SPIE Proceedings, Vol. 30–38, pp. 30–38 (Feb. 1997) and Aoki, et al., "Novel Structure MQW Electroabsorption Modulator IDFB Laser . . . " Electronics Letters, vol. 27, pp. 2138–2140 (Nov. 1991), which are incorporated by reference herein). The transfer function of such lasers, which is the light output as a function of voltage across the modulator, tends to be highly nonlinear. In particular, a sharp transfer function is exhibited, which is suitable for digital applications. However, analog applications normally require a linear transfer function.

In order to produce a more linear transfer function, it has been proposed to apply a predistortion to the input RF signal to the laser. This solution tends to be expensive and complex.

It is desirable, therefore, to provide a modulator which exhibits a fairly linear transfer function without the need for external circuitry.

SUMMARY OF THE INVENTION

The invention in one aspect is a modulator which includes a waveguide region of semiconductor material having a graded band gap along a direction selected from a path of light propagation through the modulator and a path perpendicular to the path of light propagation. In accordance with another aspect, the invention is an electroabsorption modulated laser including a laser and modulator formed on a substrate and having a waveguide region of semiconductor material, wherein the portion of the region defining the modulator has a graded band gap along a direction selected from a path of light propagation through the modulator and a path perpendicular to the path of light propogation. In accordance with a further aspect, the invention is a method for forming a modulator comprising selectively growing a layer of semiconductor material on a substrate wherein a mask is used to define the area of growth, and the width of the mask is varied in a direction selected from a path of light propogation through the modulator and a path perpendicular to the path of light propagation.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

Figure 1:
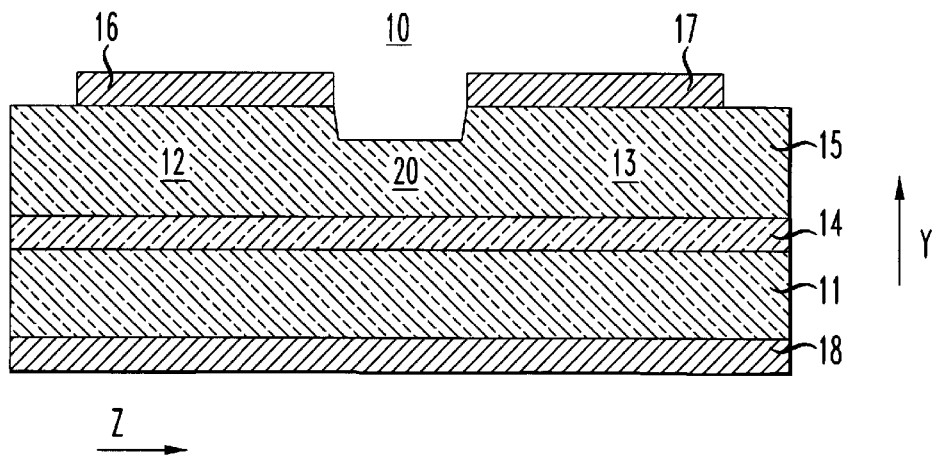
FIG. 1 is a cross sectional view of an electroabsorption modulated laser in accordance with an embodiment of the invention.
Figure 2:
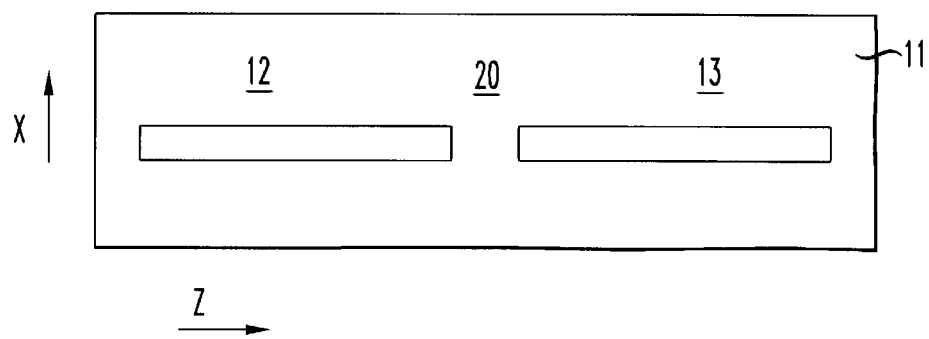
FIG. 2 is a plan view of the laser illustrated in FIG. 1.

FIGS. 1 and 2 illustrate, in a cross sectional and plan view, a typical electroabsorption modulated (EML) laser, 10, which may be fabricated according to an embodiment of the invention. The device is formed on a substrate, 11, which can be, for example, InP. Regions, 12 and 13, which comprise the laser and modulator portions, respectively, of the device, 10, are formed by depositing a plurality of semiconductor layers, to be described, typically by chemical vapor deposition. In particular, a multiquantum well waveguide region, 14, is formed on the substrate, 11. As known in the art, this region comprises a plurality of layers, such as InGaAsP where the bandgap in region 12 is chosen to emit light and the bandgap in region 13 is chosen to absorb light when a bias is applied across these regions. A transition region, 20, is formed between the laser region, 12, and the modulator region, 13. At least one further semiconductor layer, 15, such as InP, is deposited over the active region, 14. In order to apply the bias, electrodes 16 and 17 are deposited over the laser region, 12, and modulator region, 13, respectively, on the top surface of the layer, 15. A further electrode, 18, is deposited over the bottom surface of the substrate, 11. (It will be noted that in the top view, the electrodes are omitted for purposes of illustration.)

Figure 5:
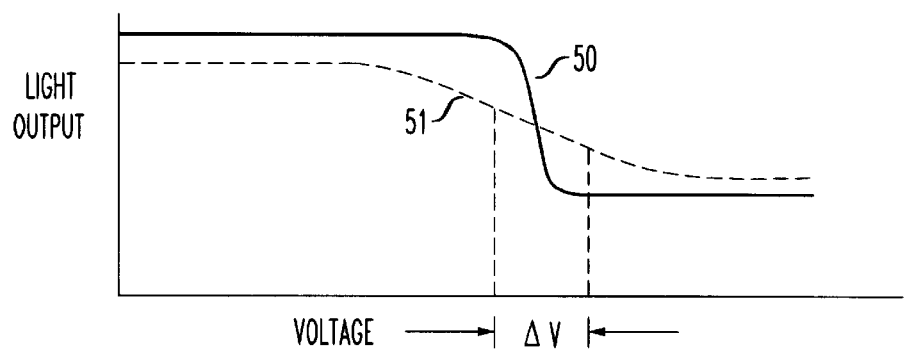
FIG. 5 is an illustration of light output as a function of voltage for the device of figs 1and 2 compared with a prior art device.

The typical EML laser has a transfer function, which is light output as a function of voltage applied across the modulator region, 13, illustrated as curve 50 in FIG. 5. It will be noted that there is an abrupt transition between the maximum light output (ON state) and the minimum light output (OFF state). However, for analog applications, a transfer function illustrated as curve 51 is more desirable. In particular, the curve exhibits a linear portion between the maximum light (ON state) and minimum light (OFF state) with a slope which is constant to within approximately 1 percent over the operating voltage, $\Delta V$, of the device. Desirably, this slope is within the range 1–5 dB/volt. Typically, $\Delta V$ is .5 volts or less.

Figure 4:
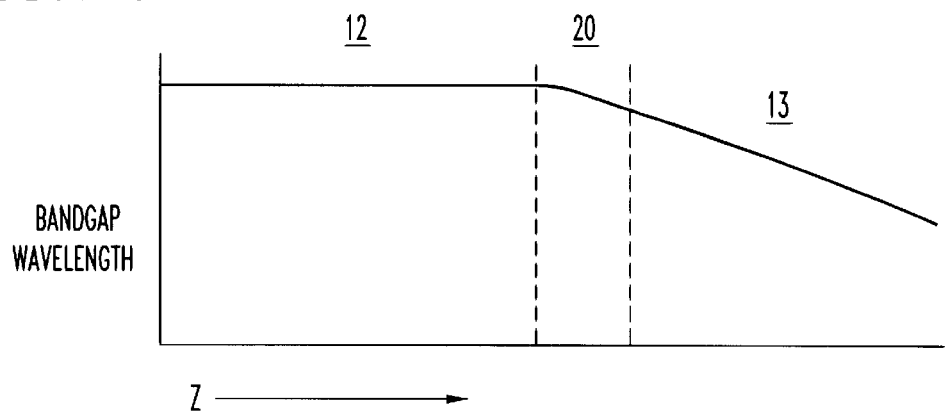
FIG. 4 is an illustration of bandgap wavelength of the laser of FIGS. 1 and 2 along the direction of propagation of light.

In accordance with a preferred feature of the invention, such a transfer function can be achieved by a bandgap distribution such as shown in FIG. 4 which illustrates bandgap wavelength as a function of distance along the direction of light propagation (Z direction) for the device of FIGS. 1 and 2. It will be noted that the bandgap remains constant over the laser region, 12, and starts to decrease at the transition region, 20, between the laser and modulation regions. The modulator region, 13, exhibits a graded bandgap which starts at a high value, typically 1.55–1.60$\mu$m and then decreases to a low value, typically 1.50–1.55$\mu$m, in an essentially linear fashion. Preferably, the slope of the bandgap curve is within the range 10 nm/v–30 nm/v.

Figure 3:
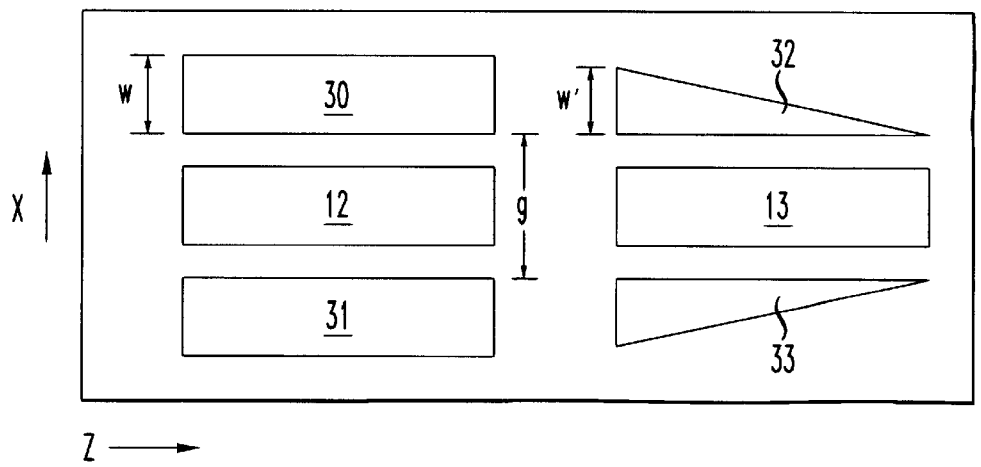
FIG. 3 is a plan view of the laser of FIGS. 2 and 3 during a certain stage of fabrication in accordance with an aspect of the invention.

The desired bandgap grading can be achieved in accordance with one embodiment of a method aspect of the invention as illustrated in FIG. 3. As shown, the semiconductor layers, 14 and 15, which make up the laser and modulator regions, 12 and 13, are formed using a mask layer formed into a pattern including segments 30–33. In this example, the mask is silicon dioxide which is defined by standard photolithography. However, other types of masks can be employed. The layer 14 is deposited by standard chemical vapor deposition (MOCVD) on the areas of the substrate exposed by the mask.

It will be noted that the segments, 30 and 31, which define the laser region, 12, have a constant width, w, over the entire region. The segments, 32 and 33, which define the modulator region, 13, start with a width (w') which is smaller than segments 30 and 31, and then decreases in width along the direction of light propagation (Z direction). In vapor deposition, the individual constituents of the layer being deposited (in this example, In, P, Ga and As) which are incident on the mask segments tend to migrate toward the exposed portions of the substrate. Thus, the semiconductor layers formed in the areas of the substrate with less exposure by the mask (region 12) will have a higher growth rate than areas having more exposure (region 13) even though the gap, g, between the segments is constant. Since the bandgap is a function of the growth rate of the layer being deposited, the bandgap wavelength in the modulator will be graded from a high value where the mask segment is widest to a low value where the mask segment is narrowest.

Figure 6:
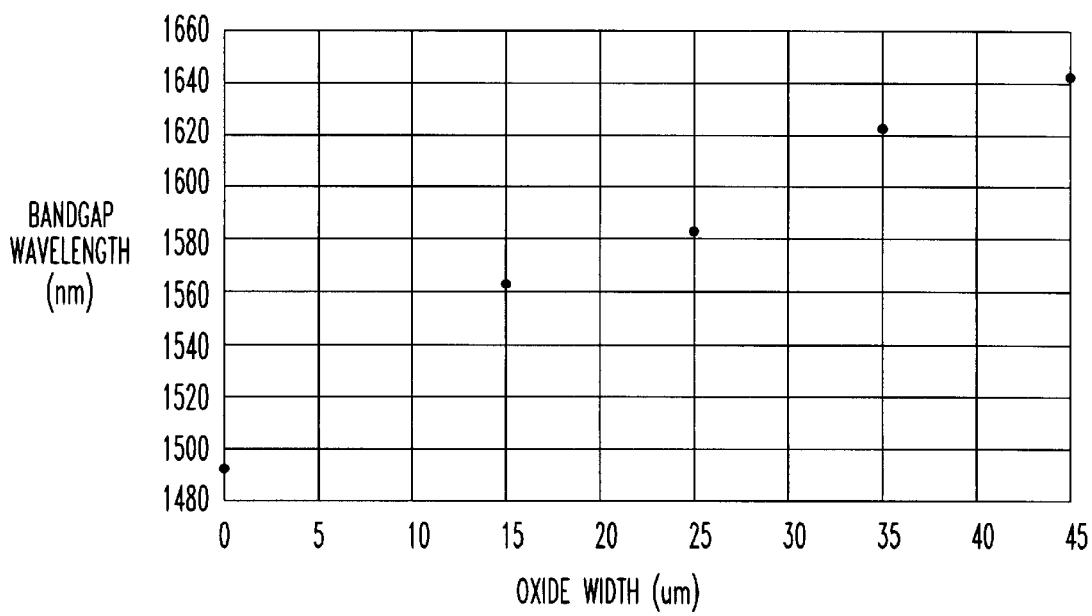
FIG. 6 is an illustration of bandgap wavelength as a function of the width of a mask used to fabricate the device of FIGS. 1 and 2.

In particular, FIG. 6 illustrates bandgap wavelength of the layer, 14, in region, 13, as a function of the width, w', of the mask segments, 32 and 33 for a constant gap, g, of 20 $\mu$m It is apparent that the oxide width can be varied to achieve a grading of the bandgap along the direction of light propagation. In this example, the width, w', starts at a value of approx 45 $\mu$m and tapers to a value of approx 0 $\mu$m to achieve the bandgap grading of FIG. 4. It is preferrable that the bandgap wavelength vary by at least 20 nm in the modulator region. The oxide width preferrably should vary at least 2 $\mu$m, and most preferably at least 10 $\mu$m.

Various modifications of the invention as described will be apparent to those skilled in the art. For example, although the device shown is a combination of laser and modulator, the invention can be utilized for discrete modulators as well. Further, although the bandgap was graded along the direction of light propagation, it could instead be graded in a direction which is perpendicular to light propogation in either the x or y direction since the relative absorption and transmission of light in the modulator region as a function of voltage will be affected in either case. Further, if the bandgap is to be graded in the x-direction (See FIG. 3) the placement of the oxide pads may be asymmetrical about the optical axis of the device.

What is claimed is:

1. An optical modulator comprising a waveguide region of semiconductor material wherein the waveguide region has a bandgap wavelength which varies along a path perpendicular to the path of light propagation.

2. A modulator according to claim 1 wherein the bandgap wavelength varies from a maximum within the range 1.55–1.60 $\mu$m to a minimum within the range 1.50–1.55$\mu$m.

3. A modulator according to claim 1 wherein the bandgap wavelength varies by an amount of at least 20 nm.

4. A modulator according to claim 1 wherein the modulator exhibits a transfer function having a slope within the range 1–5 dB/volt between a maximum and minimum value.

5. A modulator according to claim 1 wherein the semiconductor material comprises InGaAsP.

6. An electroabsorption modulated laser comprising a laser and a modulator formed on a substrate and including a waveguide region of semiconductor material wherein the portion of waveguide region defining the modulator has a bandgap wavelength which varies along a path perpendicular to the path of light propagation.

7. A laser according to claim 6 wherein the bandgap wavelength varies from a maximum within the range 1.55–160$\mu$m to a minimum within the range 1.50-1.55$\mu$m.

8. A laser according to claim 6 wherein the bandgap wavelength varies by an amount of at least 20 nm.

9. A laser according to claim 6 wherein the modulator exhibits a transfer function having a slope within the range 1–5 dB/volt between a maximum and minimum value.

10. A laser according to claim 6 wherein the semiconductor material comprises InGaAsP.

11. A method of operating an optical modulator with a waveguide region of semiconductor material wherein the waveguide region has a bandgap wavelength which varies along a certain direction, comprising the steps of:
propogating light through the modulator in the said direction; and
applying an analog signal to said modulator to produce an analog output optical signal from the modulator.

12. A method of operating an optical modulator with a waveguide region of semiconductor material wherein the waveguide region has a bandgap wavelength which varies along a certain direction, comprising steps of:
propogating light through the modulator in a direction which is perpendicular to said certain direction; and
applying an analog signal to said modulator to produce an analog output optical signal from the modulator.

13. The method according to claim 11 or 12 wherein the output optical signal has a linear transfer function between a maximum and minimum light value.

14. The method according to claims 11 or 12 wherein the output optical signal has a transfer function with a slope within the range 1–5 dB/volt between s maximum and minimum light value.

15. The method according to claim 11 or 12 wherein the output signal has a transfer function with a slope between a maximum and minimum light value which is constant to within approximately 1% of the operating voltage of the modulator.

* * * * *